United States Patent
Xiong et al.

(10) Patent No.: US 11,322,657 B2
(45) Date of Patent: May 3, 2022

(54) FLIP-CHIP LIGHT EMITTING DEVICE AND PRODUCTION METHOD THEREOF

(71) Applicant: Quanzhou Sanan Semiconductor Technology Co., Ltd., Nanan (CN)

(72) Inventors: Weiping Xiong, Xiqing (CN); Xin Wang, Xiqing (CN); Zhiwei Wu, Xiqing (CN); Di Gao, Xiqing (CN); Chun-I Wu, Xiqing (CN); Duxiang Wang, Xiqing (CN)

(73) Assignee: QUANZHOU SANAN SEMICONDUCTOR TECHNOLOGY CO., LTD., Nanan (CN)

( * ) Notice: Subject to any disclaimer, the term of this patent is extended or adjusted under 35 U.S.C. 154(b) by 21 days.

(21) Appl. No.: 17/002,423

(22) Filed: Aug. 25, 2020

(65) Prior Publication Data

US 2021/0066551 A1 Mar. 4, 2021

(30) Foreign Application Priority Data

Aug. 29, 2019 (CN) .......................... 201910809304.5

(51) Int. Cl.
*H01L 33/00* (2010.01)
*H01L 33/22* (2010.01)
*H01L 33/44* (2010.01)
*H01L 33/30* (2010.01)

(52) U.S. Cl.
CPC .......... *H01L 33/44* (2013.01); *H01L 33/0062* (2013.01); *H01L 33/0093* (2020.05); *H01L 33/22* (2013.01); *H01L 33/30* (2013.01); *H01L 2933/0025* (2013.01)

(58) Field of Classification Search
CPC ..... H01L 33/0062; H01L 33/22; H01L 33/44; H01L 33/0058; H01L 33/56; H01L 33/0066; H01L 33/005; H01L 33/0093; H01L 33/36; H01L 33/58; H01L 2933/0025; H01L 33/30
See application file for complete search history.

(56) References Cited

U.S. PATENT DOCUMENTS 9,543,484 B1 1/2017 Toshiba

OTHER PUBLICATIONS

Search Report appended to an Office Action, which was issued to Chinese counterpart application No. 201910809304.5 by the CNIPA dated Jun. 30, 2020 with an English translation thereof.

*Primary Examiner* — Savitri Mulpuri
(74) *Attorney, Agent, or Firm* — Thomas | Horstemeyer, LLP.

(57) ABSTRACT

A flip-chip light emitting device includes a transparent substrate, an epitaxial light-emitting structure, a transparent bonding layer interposed between the transparent substrate and the light-emitting structure, and a protective insulating layer disposed over the light-emitting structure and the bonding layer. The transparent bonding layer has a smaller-thickness section that has a first contact surface for the protective insulating layer to be disposed thereover, and a larger-thickness section that has a second contact surface meshing with and bonded to a roughened bottom surface of the light-emitting structure. The first contact surface is smaller in roughness than the second contact surface. A method for producing the device is also disclosed.

9 Claims, 5 Drawing Sheets

FLIP-CHIP LIGHT EMITTING DEVICE AND PRODUCTION METHOD THEREOF

CROSS-REFERENCE TO RELATED APPLICATION

This application claims priority of Chinese Patent Application No. 201910809304.5, filed on Aug. 29, 2019.

FIELD

The disclosure relates to a light emitting device and a production method thereof, and more particularly to a flip-chip light emitting device and a production method thereof.

BACKGROUND

Referring to FIG. 1, a conventional flip-chip light emitting device includes a transparent substrate 11, a transparent bonding layer 12, an epitaxial light-emitting structure, a first electrode 18, a second electrode 17, and a protective insulating layer 16. The light-emitting structure is connected with the transparent substrate 11 through the transparent bonding layer 12, and includes a first-type electrically conductive layer 13, an active layer 14, and an second-type electrically conductive layer 15 that are sequentially disposed on the transparent bonding layer 12 in such order. The active layer 14 is composed of quantum wells. The first and second electrodes 18, 17 are respectively disposed on the first-type and second-type electrically conductive layers 13, 15. The protective insulating layer 16 is disposed over the light-emitting structure and the bonding layer 12.

In order to enhance the light emission efficiency, a roughened interface 19 is formed between the first-type electrically conductive layer 13 and the transparent bonding layer 12, and between the protective insulating layer 16 and the transparent bonding layer 12. However, in one aspect, interstices exist at the part of the roughened interface 19 between the transparent bonding layer 12 and the protective insulating layer 16, such that liquids for processing the flip-chip light emitting device, water vapor, metal ions from solder, and so forth might undesirably pass through these interstices and hence lead to damages of the light-emitting structure. In another aspect, cracks might be generated in the protective insulating layer 6 during the cutting process of the flip-chip light emitting device. Thus, the protective insulating layer 6 might be undesirably detached due to the aforesaid drawbacks, leading to failure of the protective function of the protective insulating layer 6.

SUMMARY

Therefore, an object of the disclosure is to provide a flip-chip light emitting device and a production method thereof that can alleviate at least one of the drawbacks of the prior art.

The flip-chip light emitting device includes a transparent substrate, an epitaxial light-emitting structure that has a top surface and a roughened bottom surface opposite to the top surface and facing toward the transparent substrate, a transparent bonding layer that is interposed between the transparent substrate and the light-emitting structure, and a protective insulating layer that is disposed over the light-emitting structure and the bonding layer. The transparent bonding layer has a larger-thickness section that is bonded to the light-emitting structure, and a smaller-thickness section that extends from the larger-thickness section and that is bonded to the protective insulating layer. The smaller-thickness section has a first contact surface that faces away from the transparent substrate and that the protective insulating layer is disposed thereover. The larger-thickness section has a second contact surface that faces away from the transparent substrate, and that meshes with and is bonded to the roughened bottom surface of the light-emitting structure. The first and second contact surfaces of the transparent bonding layer respectively have first and second roughnesses. The first roughness of the first contact surface is less than the second roughness of said second contact surface.

The production method includes the following steps. An epitaxial light-emitting structure is provided, and has a top surface and a bottom surface that is opposite to the top surface. The bottom surface of the light-emitting structure is roughened. A transparent bonding layer is formed on the roughened bottom surface of the light-emitting structure. A transparent substrate is connected to the bonding layer so that the transparent substrate is disposed on the bonding layer opposite to the light-emitting structure. The light-emitting structure is partially removed so as to expose a portion of the bonding layer. A thickness of the exposed portion of the transparent bonding layer is partially reduced so that the transparent bonding layer has a larger-thickness section bonded to the light-emitting structure, and a smaller-thickness section extending from the larger-thickness section. The smaller-thickness section has a first contact surface that faces away from the transparent substrate and that is exposed. A protective insulating layer is formed over the light-emitting structure and the first contact surface of the transparent bonding layer, so that the smaller-thickness section of the transparent bonding layer contacts the protective insulating layer. The larger-thickness section of the transparent bonding layer has a second contact surface that faces away from the transparent substrate, and that meshes with and is bonded to the roughened bottom surface of the light-emitting structure. The first and second contact surfaces of the transparent bonding layer respectively have first and second roughnesses. The first roughness of the first contact surface is less than the second roughness of the second contact surface.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 7:
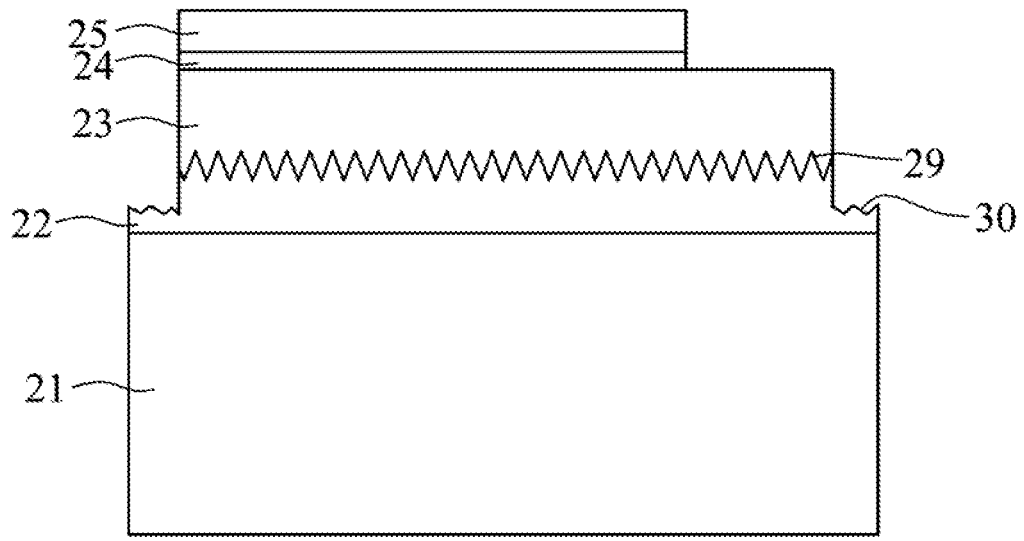
Figure 8:
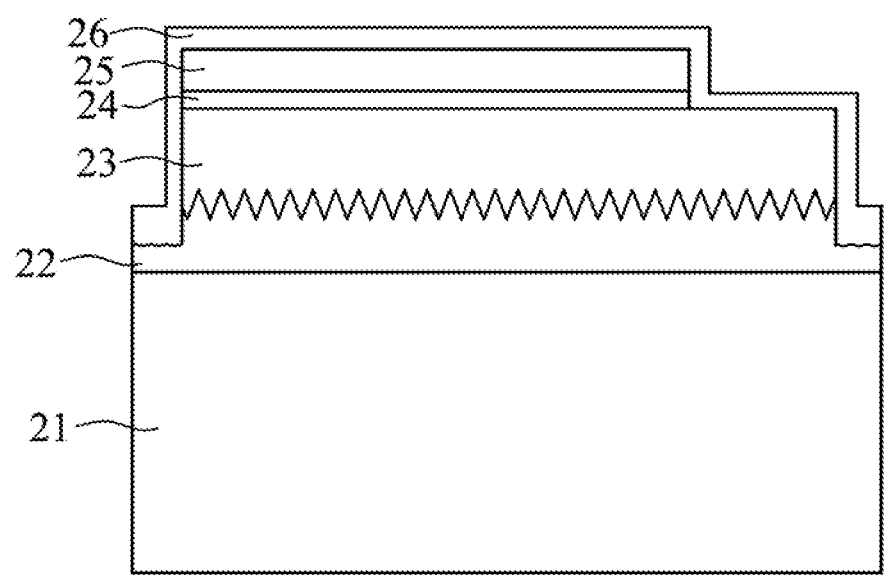
Figure 9:
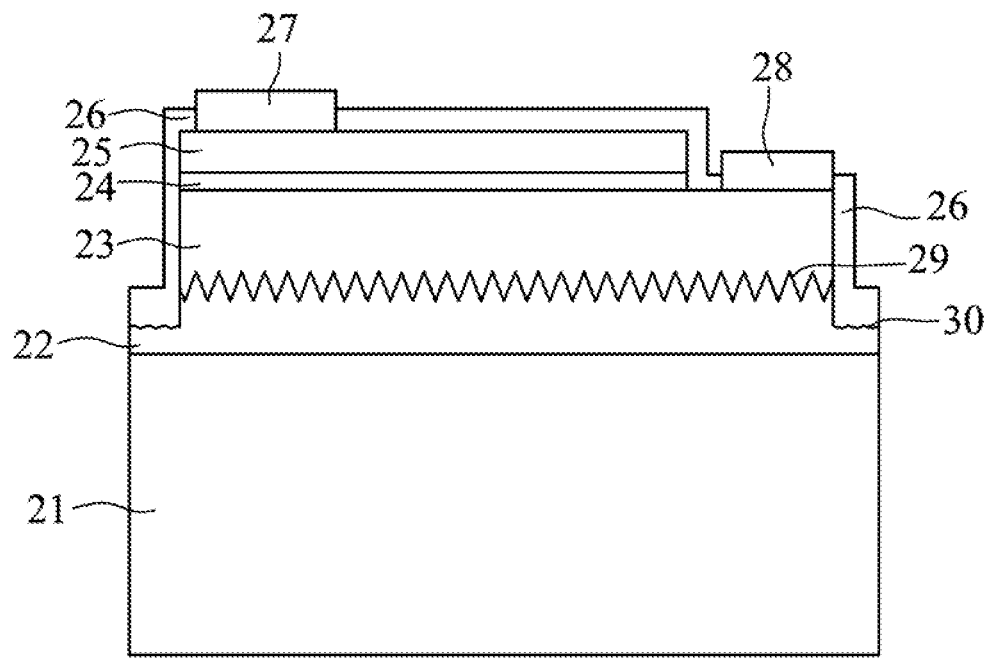

FIGS. 2 to 9 illustrate an embodiment of a method for producing a flip-chip light emitting device according to the present disclosure. Thus, the flip-chip light emitting device produced by the aforesaid embodiment of the method as shown in FIG. 9 is an embodiment of a flip-chip light emitting device according to the present disclosure.

The aforesaid embodiment of the method includes steps 1 to 8.

Figure 1:
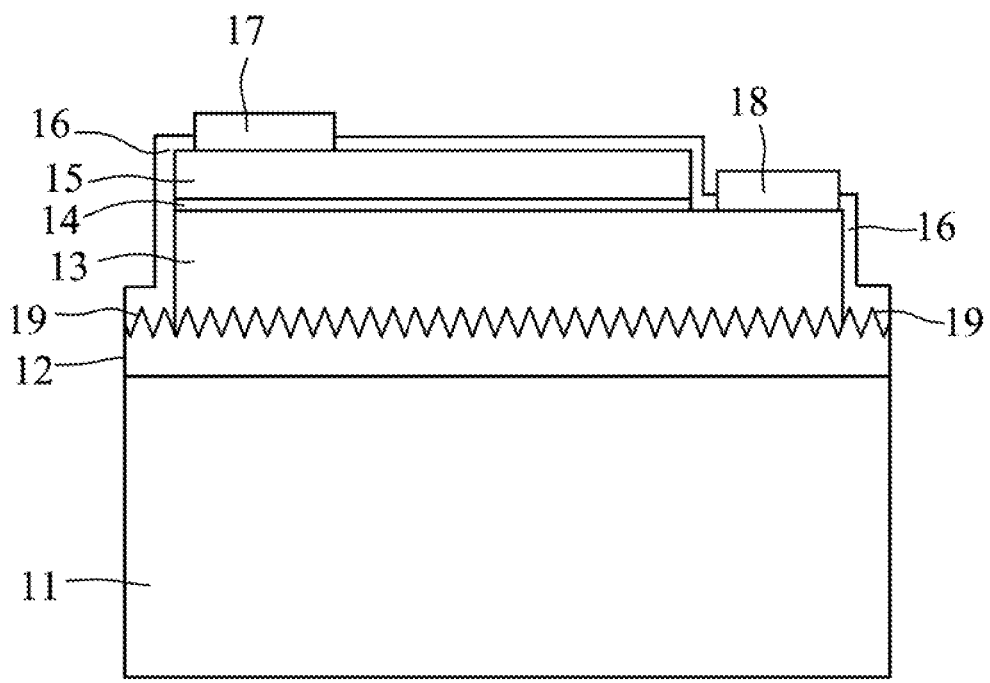
FIG. 1 is a schematic sectional view illustrating a conventional flip-chip light emitting device.
Figure 2:
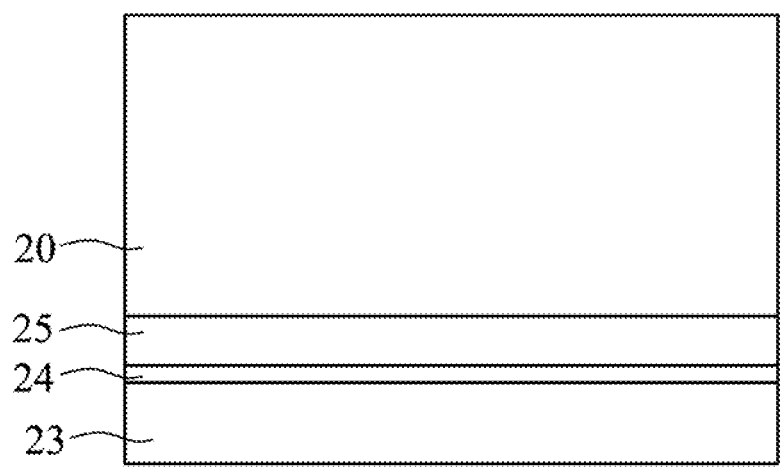
FIGS. 2 and 9 are schematic sectional views respectively illustrating steps 1 to 8 in an embodiment of a method for producing a flip-chip light emitting device according to the present disclosure.

In step 1, referring to FIG. 2, a growth substrate 20 and an epitaxial light-emitting structure formed thereon are provided. The light-emitting structure includes a first-type electrically conductive layer 23, an active layer 24 that is disposed on the first-type electrically conductive layer 23 and that is composed of quantum wells, and an second-type electrically conductive layer 25 that is disposed on the active layer 24 opposite to the first-type electrically conductive layer 23. The light-emitting structure is formed on the growth substrate 20 in a manner that the second-type electrically conductive layer 25 is disposed between the growth substrate 20 and the active layer 24.

The term "first-type" refers to being doped with a first conductivity type dopant, and the term "second-type" refers to being doped with a second conductivity type dopant that is opposite in conductivity type to the first conductivity type dopant. For instance, the first conductivity type dopant may be a p-type dopant, and the second conductivity type dopant may be an n-type dopant, and vice versa.

The active layer 24 of the light-emitting structure may be made from a material selected from the group consisting of $Al_xIn_yGa_{(1-x-y)}P$ ($0 \leq x \leq 1$, $0 \leq y \leq 1$, $0 \leq x+y \leq 1$), and $Al_xGa_{(1-x)}As$ ($0 \leq x \leq 1$). The active layer 24 of the light-emitting structure may be configured to emit light having a wavelength ranging from 570 nm and 950 nm (such as yellow light, orange light, red light, and infrared light). For instance, the active layer 24 may emit red light having a wavelength ranging from 610 nm to 650 nm.

In other embodiments, an intermediate layer (not shown in the drawings) may be disposed between the growth substrate 20 and the epitaxial light-emitting structure. The intermediate layer may be selected from the group consisting of a buffer layer (which may be made from GaAs), an etch stop layer (which may be made from InGaP), and a combination thereof.

Figure 3:
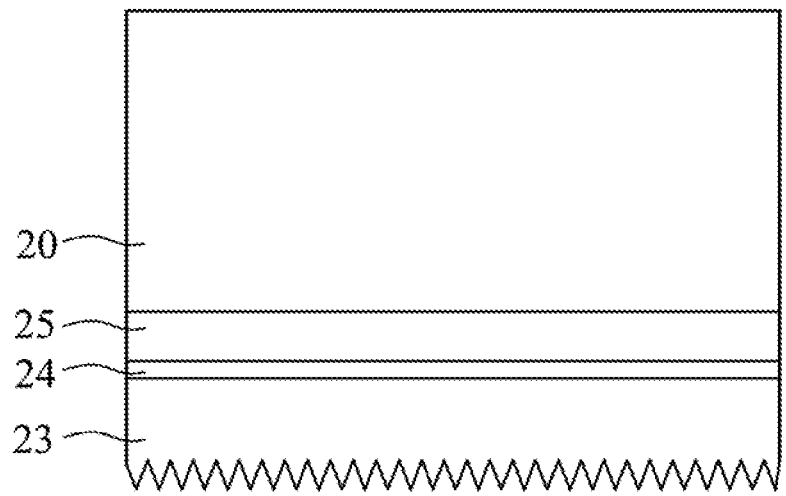

In step 2, referring to FIG. 3, a bottom surface of the first-type electrically conductive layer 23, which faces away from the growth substrate 20, and which is also a bottom surface of the light-emitting structure, is roughened (for example, through random roughening) to have a roughness (Ra) of 300 nm.

The light-emitting structure further has a top surface which is opposite to the roughened bottom surface of the light-emitting structure, and which is also a top surface of the second-type electrically conductive layer 25 facing toward the growth substrate 20, and side walls which interconnect the top and bottom surfaces of the light-emitting structure, and which are composed of side walls of the second-type electrically conductive layer 25, the active layer 24, and the first-type electrically conductive layer 23.

Figure 4:
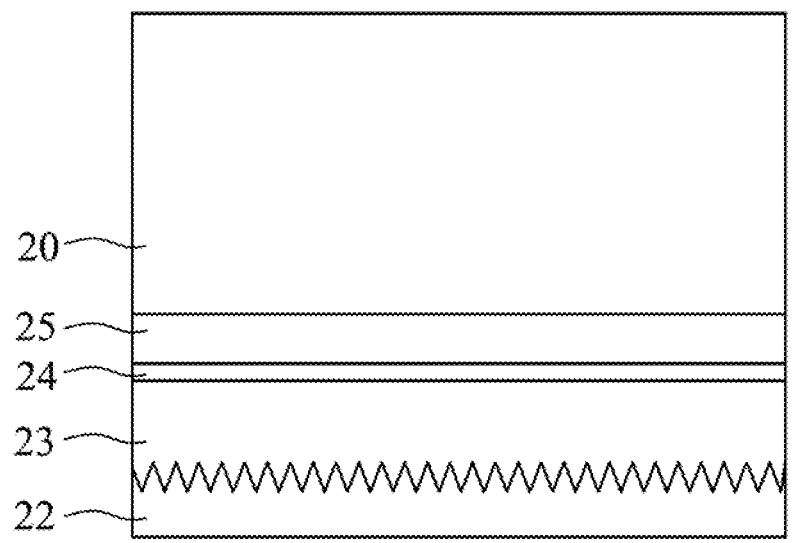

In step 3, referring to FIG. 4, a transparent bonding layer 22 is formed on the roughened bottom surface of the first-type electrically conductive layer 23 through deposition, and is subsequently subjected to polishing for facilitating connection of the transparent bonding layer 22 to a transparent substrate 21 as described below.

Figure 5:
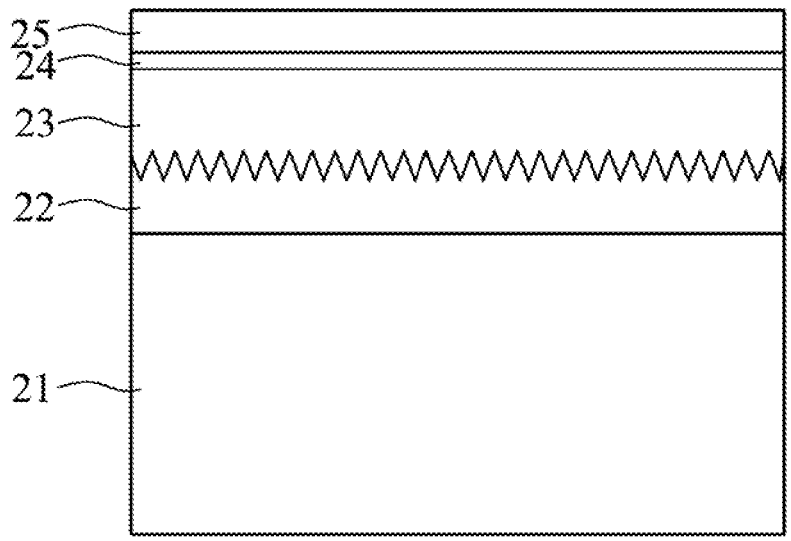

In step 4, referring to FIG. 5, the growth substrate 20 is removed (through, for example, grinding and etching) so as to expose the second-type electrically conductive layer 25 of the light-emitting structure, and the transparent substrate 21 is connected to the transparent bonding layer 22 (through, for example, high-temperature and high-pressure bonding), so that the transparent substrate 21 is disposed on the transparent bonding layer 22 opposite to the light-emitting structure (i.e. the light-emitting structure is connected with the transparent substrate 21 through the transparent bonding layer 22). In other embodiments, when the aforesaid intermediate layer is disposed between the growth substrate 20 and light-emitting structure, the aforesaid intermediate layer is removed with the growth substrate 20 in step 4.

In this embodiment, the transparent substrate 21 is made from sapphire and has a thickness of 90 μm, and the transparent bonding layer 22 is made from an insulation material (e.g. silicon dioxide).

Light emitted from the light-emitting structure passes through the transparent bonding layer 22 and the the transparent substrate 21, thereby being emitted out from the flip-chip light emitting device.

Figure 6:
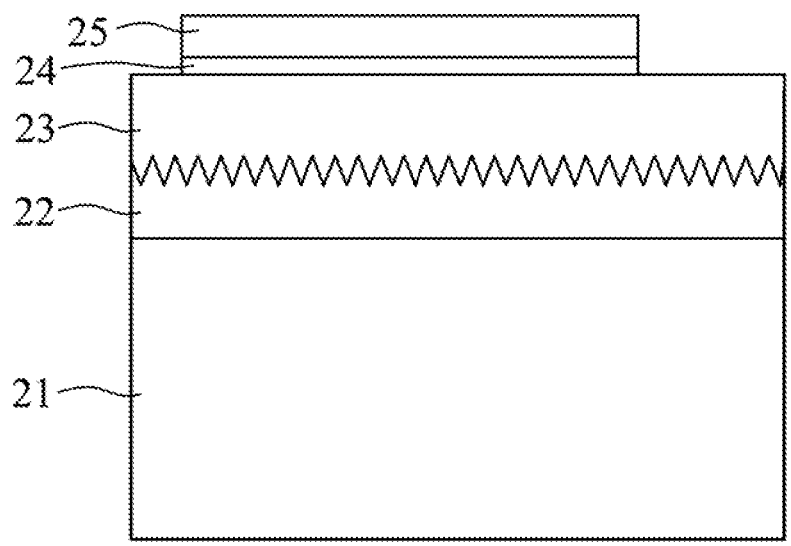

In step 5, referring to FIG. 6, through a photolithography process employing a photoresist, the second-type electrically conductive layer 25 and the active layer 24 are partially removed so as to partially expose the first-type electrically conductive layer 23.

In step 6, referring to FIG. 7, through a photolithography process employing a photoresist, a periphery of the first-type electrically conductive layer 23 is removed so as to expose a portion of the transparent bonding layer 22. Subsequently, via etching, the exposed portion of the transparent bonding layer 22 is subjected to thickness reduction, so that a first contact surface 30 of the transparent bonding layer 22 facing away from the transparent substrate 21 is formed and exposed.

The transparent bonding layer 22 further has a second contact surface 29 that faces away from the transparent substrate 21, and that meshes with and is bonded to the roughened bottom surface of the first-type electrically conductive layer 23. The first and second contact surfaces 30, 29 of the transparent bonding layer 22 are different in roughness and maximum height.

In this embodiment, the transparent bonding layer 22 further has smooth lateral walls that interconnect the first and second contact surfaces 30, 29.

The transparent bonding layer 22 may have a thickness ranging from 1 μm to 5 μm.

Figure 10:
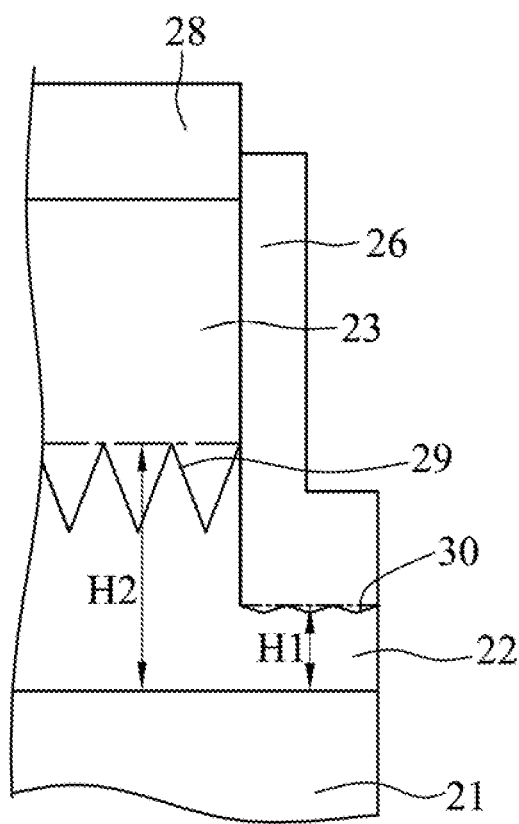
FIG. 10 is a fragmentary, enlarged sectional view illustrating first and second contact surfaces of a flip-chip light emitting device produced by the embodiment of the method.

In this embodiment, the first and second contact surfaces 30, 29 of the transparent bonding layer 22 respectively have first and second maximum heights (H1, H2) measured from the transparent substrate 21 (see FIG. 10).

Namely, a larger-thickness section of the transparent bonding layer 22, which is interposed between the first-type electrically conductive layer 23 and the transparent substrate 21, has the second contact surface 29 and hence a maximum thickness equal to the second maximum height (H2). Moreover, a smaller-thickness section of the transparent bonding layer 22, which extends from the larger-thickness section, has the first contact surface 30 and a maximum thickness equal to the first maximum height (H1).

In this embodiment, the first maximum height (H1) of the first contact surface 30 is lower than a second minimum height of the second contact surface 29 measured from the transparent substrate 21.

In this embodiment, the second maximum height (H2) of the second contact surface 29, i.e. the maximum thickness of the larger-thickness section of the transparent bonding layer 22, is 3 μm. The first maximum height (H1) of the first contact surface 30, i.e. the maximum thickness of the smaller-thickness section of the transparent bonding layer 22, is 2 μm. However, in another embodiment, the first maximum height (H1) of the first contact surface 30 may be lower than the second maximum height (H2) of the second contact surface 29 by at least 200 nm.

The first and second contact surfaces 30, 29 of the transparent bonding layer 22 respectively have first and second roughnesses (Ra). The first roughness of the first contact surface 30 is less than the second roughness of the second contact surface 29. The first roughness of the first contact surface 30 may be not greater than 50 nm, and the second roughness of the second contact surface 29 may be equal to or greater than 100 nm and not greater than 500 nm.

In this embodiment, the first roughness of the first contact surface 30 is 20 nm, and the second roughness of the second contact surface 29 is 300 nm.

The first contact surface 30 of the transparent bonding layer 22 may have a width ranging from 10 μm to 20 μm.

In step 7, referring to FIG. 8, via deposition, a protective insulating layer 26 is formed over the second-type electrically conductive layer 25 (over the top surface and the side walls thereof), over the active layer 24 (over the side walls thereof), over the first-type electrically conductive layer 23 (over atop surface and the side walls thereof), and over the transparent bonding layer 22 (over the first contact surface 30 and the smooth lateral walls thereof). Therefore, the protective insulating layer 26 hence has a roughened lower surface which faces toward the transparent substrate 21, and the first contact surface 30 of the transparent bonding layer 22 meshes with and is bonded to the roughened lower surface of the protective insulating layer 26. Accordingly, the protective insulating layer 26 sufficiently covers the light-emitting structure and can hence effectively protect the same. It should be noted that the protective insulating layer 26 may be partially or completely disposed over the first contact surface 30 of the bonding layer 22.

In step 8, referring to FIGS. 9 and 10, the protective insulating layer 26 is subjected to a hole-forming process, so that a first through hole is formed to partially expose the first-type electrically conductive layer 23, and so that a second through hole is formed to partially expose the second-type electrically conductive layer 25. Further, a first electrode 28 and a second electrode 27 are respectively disposed in the first and second through holes of the protective insulating layer 26 to be correspondingly electrically connected with the first-type electrically conductive layer 23 and the second-type electrically conductive layer 25. Accordingly, the flip-chip light emitting device is produced.

The flip-chip light emitting device thus produced may be configured to emit, through the transparent substrate 21, light such as red light or infrared light.

Since the first roughness of the first contact surface 30 of the transparent bonding layer 22 is lower than the second roughness of the second contact surface 29 of the transparent bonding layer 22, the number of interstices at the interface between the first contact surface 30 of the transparent bonding layer 22 and the protective insulating layer 26 can be greatly reduced. In addition, the vertical, smooth lateral walls of the transparent bonding layer 22 interconnecting the first and second contact surfaces 30, 29 of the transparent bonding layer 22 not only separate the first and second contact surfaces 30, 29, but also allow the protective insulating layer 26 to be well disposed thereover (i.e. no interstice is formed between the smooth lateral walls of the transparent bonding layer 22 and the protective insulating layer 26). In view of the foregoing, the protective insulating layer 26 can be prevented from cracking and undesired detachment attributed to interstices, thus effectively protecting the light-emitting structure.

In addition, the larger-thickness section of the transparent bonding layer 22 not only can provide sufficient bonding strength between the light-emitting structure and the transparent substrate 21, but also is sufficiently large in area to be polished for facilitating the connection of the transparent bonding layer 22 to the transparent substrate 21.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method for producing a flip-chip light emitting device, comprising:
    providing an epitaxial light-emitting structure having a top surface and a bottom surface that is opposite to the top surface;
    roughening the bottom surface of the light-emitting structure;
    forming a transparent bonding layer on the roughened bottom surface of the light-emitting structure;
    connecting a transparent substrate to the transparent bonding layer so that the transparent substrate is disposed on the transparent bonding layer opposite to the light-emitting structure;
    partially removing the light-emitting structure so as to expose a portion of the transparent bonding layer;
    partially reducing a thickness of the exposed portion of the transparent bonding layer, so that the transparent bonding layer has a larger-thickness section bonded to the light-emitting structure, and a smaller-thickness section extending from the larger-thickness section, the smaller-thickness section having a first contact surface that faces away from the transparent substrate, and that is exposed; and
    forming a protective insulating layer over the light-emitting structure and the first contact surface of the transparent bonding layer, so that the smaller-thickness section of the transparent bonding layer contacts the protective insulating layer,
    wherein the larger-thickness section of the transparent bonding layer has a second contact surface that faces away from the transparent substrate, and that meshes with and is bonded to the roughened bottom surface of the light-emitting structure, the first and second contact surfaces of the transparent bonding layer respectively having first and second roughnesses, the first roughness of the first contact surface being less than the second roughness of the second contact surface, wherein the light-emitting structure includes a first-type electrically conductive layer that has the roughened bottom surface of the light-emitting structure bonded to the second contact surface of the transparent bonding layer, an active layer that is disposed on the first-type electrically conductive layer opposite to the transparent bonding layer, and a second-type electrically conductive layer that is disposed on the active layer opposite to the first-type electrically conductive layer and that has the top surface of the light-emitting structure, the light-emitting structure further having a side wall that interconnects the top and bottom surfaces of the light-emitting structure, the transparent bonding layer further having a lateral wall that interconnects the first and second contact surfaces of the transparent bonding layer, the protective insulating layer being disposed over the top surface and the side wall of the light-emitting structure, and over the first contact surface and the lateral wall of the transparent bonding layer.

2. The method as claimed in claim 1, wherein, after formation of the protective insulating layer, the protective insulating layer has a roughened lower surface that faces toward the transparent substrate, the first contact surface of the transparent bonding layer meshing with and being bonded to the roughened lower surface of the protective insulating layer.

3. The method as claimed in claim 1, wherein, after connection of the transparent substrate to the transparent bonding layer, the transparent bonding layer interconnects the transparent substrate and the light-emitting structure.

4. The method as claimed in claim 1, wherein the transparent bonding layer is formed through deposition and is subsequently subjected to polishing.

5. The method as claimed in claim 1, wherein the first and second contact surfaces of the transparent bonding layer respectively have first and second maximum heights measured from the transparent substrate, the first maximum height of the first contact surface being lower than the second maximum height of the second contact surface.

6. The method as claimed in claim 1, wherein the transparent bonding layer has a thickness ranging from 1 μm to 5 μm.

7. The method as claimed in claim 1, wherein the first contact surface of the transparent bonding layer has a width ranging from 10 μm to 20 μm.

8. The method as claimed in claim 1, wherein the first roughness of the first contact surface of the transparent bonding layer is not greater than 50 nm.

9. The method as claimed in claim 1, wherein the second roughness of the second contact surface of the transparent bonding layer is not less than 100 nm and not greater than 500 nm.

* * * * *